(12) United States Patent
Mebarki et al.

(10) Patent No.: US 10,593,592 B2
(45) Date of Patent: Mar. 17, 2020

(54) LAMINATE AND CORE SHELL FORMATION OF SILICIDE NANOWIRE

(71) Applicant: Applied Materials, Inc., Santa Clara, CA (US)

(72) Inventors: Bencherki Mebarki, Santa Clara, CA (US); Annamalai Lakshmanan, Fremont, CA (US); Kaushal K. Singh, Santa Clara, CA (US); Paul F. Ma, Santa Clara, CA (US); Mehul B. Naik, San Jose, CA (US); Andrew Cockburn, Brussels (BE); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/975,028

(22) Filed: Dec. 18, 2015

(65) Prior Publication Data

US 2016/0204029 A1 Jul. 14, 2016

Related U.S. Application Data

(60) Provisional application No. 62/101,775, filed on Jan. 9, 2015.

(51) Int. Cl.
*H01L 21/768* (2006.01)
*H01L 21/285* (2006.01)
(Continued)

(52) U.S. Cl.
CPC .. *H01L 21/76886* (2013.01); *H01L 21/28518* (2013.01); *H01L 21/28556* (2013.01);
(Continued)

(58) Field of Classification Search
CPC ......... H01L 21/76886; H01L 21/28518; H01L 21/28052; H01L 21/32051;
(Continued)

(56) References Cited

U.S. PATENT DOCUMENTS

| 4,853,251 | A | * | 8/1989 | Ishihara | .................. C23C 16/30 427/563 |
| 5,803,975 | A | * | 9/1998 | Suzuki | .................. C23C 16/345 118/723 MA |

(Continued)

FOREIGN PATENT DOCUMENTS

| EP | 0697467 A1 | * | 2/1996 | ......... C23C 16/4405 |
| JP | 2006059972 A | | 3/2006 | |

(Continued)

OTHER PUBLICATIONS

International Search Report and Written Opinion for International Application No. PCT/US2015/066808 dated Apr. 12, 2016.

*Primary Examiner* — Dale E Page
*Assistant Examiner* — Quovaunda Jefferson
(74) *Attorney, Agent, or Firm* — Patterson + Sheridan LLP

(57) ABSTRACT

Methods and apparatus for forming a metal silicide as nanowires for back-end interconnection structures for semiconductor applications are provided. In one embodiment, the method includes forming a metal silicide stack comprising as plurality of metal silicide layers on a substrate by a chemical vapor deposition process or a physical vapor deposition process, thermal treating the metal silicide stack in a processing chamber, applying a microwave power in the processing chamber while thermal treating the metal silicide layer; and maintaining a substrate temperature less than 400 degrees Celsius while thermal treating the metal silicide layer.

15 Claims, 4 Drawing Sheets

(51) Int. Cl.
*H01L 23/532* (2006.01)
*H01L 21/3205* (2006.01)

(52) U.S. Cl.
CPC .. *H01L 21/32053* (2013.01); *H01L 23/53257* (2013.01); *H01L 23/53271* (2013.01); *H01L 21/76877* (2013.01); *H01L 2221/1094* (2013.01)

(58) Field of Classification Search
CPC ......... H01L 21/32053; H01L 21/28556; H01L 23/53257; H01L 23/53271
See application file for complete search history.

(56) References Cited

U.S. PATENT DOCUMENTS

| | | | |
|---|---|---|---|
| 6,369,410 B1* | 4/2002 | Yamazaki | H01L 29/458 257/412 |
| 7,217,660 B1* | 5/2007 | Wang | H01L 21/28518 257/E21.165 |
| 7,338,896 B2 | 3/2008 | Vanhaelemeersch et al. | |
| 9,012,965 B2 | 4/2015 | Luo et al. | |
| 2003/0104666 A1 | 6/2003 | Bojarczuk et al. | |
| 2004/0103960 A1* | 6/2004 | Schmid | H01L 21/288 148/525 |
| 2005/0236663 A1* | 10/2005 | Pawlak | H01L 21/823425 257/330 |
| 2006/0096977 A1* | 5/2006 | Ripley | H05B 6/6494 219/690 |
| 2007/0061006 A1* | 3/2007 | Desatnik | A61L 27/306 623/1.42 |
| 2007/0087537 A1* | 4/2007 | Kadoshima | H01L 21/28052 438/585 |
| 2007/0202254 A1* | 8/2007 | Ganguli | C23C 16/18 427/252 |
| 2008/0014689 A1 | 1/2008 | Cleavelin et al. | |
| 2008/0254641 A1* | 10/2008 | Kobayashi | H01L 21/02118 438/763 |
| 2010/0178763 A1* | 7/2010 | Narita | H01L 21/02068 438/664 |
| 2011/0097517 A1* | 4/2011 | Stowell | C23C 14/221 427/575 |
| 2013/0196505 A1* | 8/2013 | Hasegawa | H01L 21/76898 438/664 |
| 2013/0209781 A1 | 8/2013 | Bellman et al. | |
| 2013/0334693 A1 | 12/2013 | Alptekin et al. | |
| 2015/0080208 A1 | 3/2015 | Chopra | |

FOREIGN PATENT DOCUMENTS

| | | |
|---|---|---|
| JP | 2014187300 A | 10/2014 |
| TW | 200746268 A | 12/2007 |
| TW | 200823309 A | 6/2008 |
| TW | 201349391 A | 12/2013 |
| WO | 2012015550 A2 | 2/2012 |

* cited by examiner

LAMINATE AND CORE SHELL FORMATION OF SILICIDE NANOWIRE

CROSS-REFERENCE TO RELATED APPLICATIONS

This application claims benefit of U.S. Provisional Application Ser. No. 62/101,775 filed Jan. 9, 2015, which is incorporated by reference in its entirety.

BACKGROUND

Field

Embodiments of the present disclosure generally relate to methods of forming metal silicide. More specifically, embodiments herein generally relate to metal silicide nanowires in BEOL applications.

Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. As the feature widths decrease, the device current typically remains constant or increases, which results in an increased current density for such features. Higher device densities, faster operating frequencies, and larger die sizes have created a need for a metal with lower resistivity than traditional aluminum to be used in interconnect structures. Copper materials with lower resistivity have been used for decades for its high conductivity. However, as discussed, small size effect may also result in increased resistivity of copper as line widths shrink below around 50 nm and approach the mean free path of electrons in copper (39 nm). The resistivity increase is caused by electron scattering at the surface of the line and at grain boundaries.

Copper (Cu) interconnects have been used as a replacement for Aluminum (Al) for decades. The number of transistors formed on a substrate is reaching a multi-millions range packed in small areas to keep up with Moore's law. As the number of transistors increases and the size of transistors decreases, Cu resistivity is exponentially increasing once the metal line dimension approaches or get below the Cu mean free path of 39 nm.

Post Cu era requires new interconnect materials that have low resistivity and narrower mean free path. The mean free path is the average distance traveled by a moving particle (such as an electron, an atom, or a photon) between successive impacts (collisions), which modify its direction or energy or other particle properties. Some metals are already under investigation such as cobalt (Co) interconnect, tungsten (W) Interconnect, and some metal alloys. Silicides, such as Nickel Silicide (NiSi) and Cobalt Silicide ($CoSi_2$) interconnects are strong potential candidates given the small mean free path of approximately 5 nm for NiSi. Even though NiSi resistivity is higher than Cu, the NiSi narrow mean free path of approximately 5 nm gives the NiSi a strong advantage to replace Cu for advanced future technology nodes of 7 nm and below.

However low resistivity NiSi phase formation requires high anneal temperatures of greater than 650 degrees Celsius. Such high anneal temperatures are not suitable in back-end-of-line integration (BEOL), due in part to low-k materials temperature budget limitation (less than about 400 degrees Celsius).

Therefore, there is a need for a suitable material for metal interconnection for semiconductor interconnection manufacturing process.

SUMMARY

Embodiments disclosed herein include method of making metal silicides, such as metal silicide nanowires, for BEOL applications. In one embodiment, a method of processing a substrate can include positioning a substrate in a process region of a processing chamber, the substrate having a feature formed therein; depositing a metal silicide layer into the feature, the deposition comprising; depositing a metal layer comprising a transition metal into the feature, the metal layer being no more than 2 atoms thick; delivering a silicon-containing reactant to the metal layer, the substrate being maintained at a temperature between 25 degrees Celsius and 400 degrees Celsius, the silicon-containing reactant reacting with at least a portion of the metal layer to form a metal silicide; and repeating the deposition of the metal silicide layer one or more times to deposit a metal silicide stack.

In another embodiment, a method of processing a substrate can include depositing a metal silicide layer into the feature, the deposition comprising: depositing a metal layer comprising a transition metal into the feature, the metal layer being no more than 2 atoms thick; delivering a silicon-containing reactant to the metal layer, the silicon-containing reactant reacting with at least a portion of the metal layer to form a metal silicide; and repeating the deposition of the metal silicide layer one or more times to deposit a metal silicide stack; thermally treating the substrate at a temperature between 25 degrees Celsius and 400 degrees Celsius in the presence of radiant energy; and applying a microwave power in the process chamber while thermal treating the metal silicide stack.

In another embodiment, a method of processing a substrate can include positioning a substrate in a process chamber, the substrate having a feature formed therein; depositing a nickel silicide layer into the feature, the deposition comprising: depositing a nickel layer into the feature, the nickel layer being a monolayer; delivering a silane to the nickel layer, the substrate being maintained at a temperature between 25 degrees Celsius and 400 degrees Celsius, the silane reacting with at least a portion of the nickel layer to form a nickel silicide layer; and repeating the deposition of the nickel silicide layer one or more times to deposit a metal silicide stack; and applying a microwave power in the process chamber while thermal treating the metal silicide stack.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure describe methods for forming a metal silicide layer that may be utilized as conductive nanowires in back-end interconnect structures for semiconductor device manufacturing. In one example, the metal silicide layer is formed by a deposition process under a temperature less than 400 degrees Celsius. The metal silicide nanowires can be deposited using a cyclic deposition technique. Suitable deposition techniques may be utilized to form the metal silicide layer include plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD) and the like, or any suitable deposition techniques. In one example, the metal silicide layer may be formed by a chemical vapor deposition with IR light and microwave enhanced plasma. Embodiments disclosed herein are more clearly described with reference to the figures below.

Figure 1A:
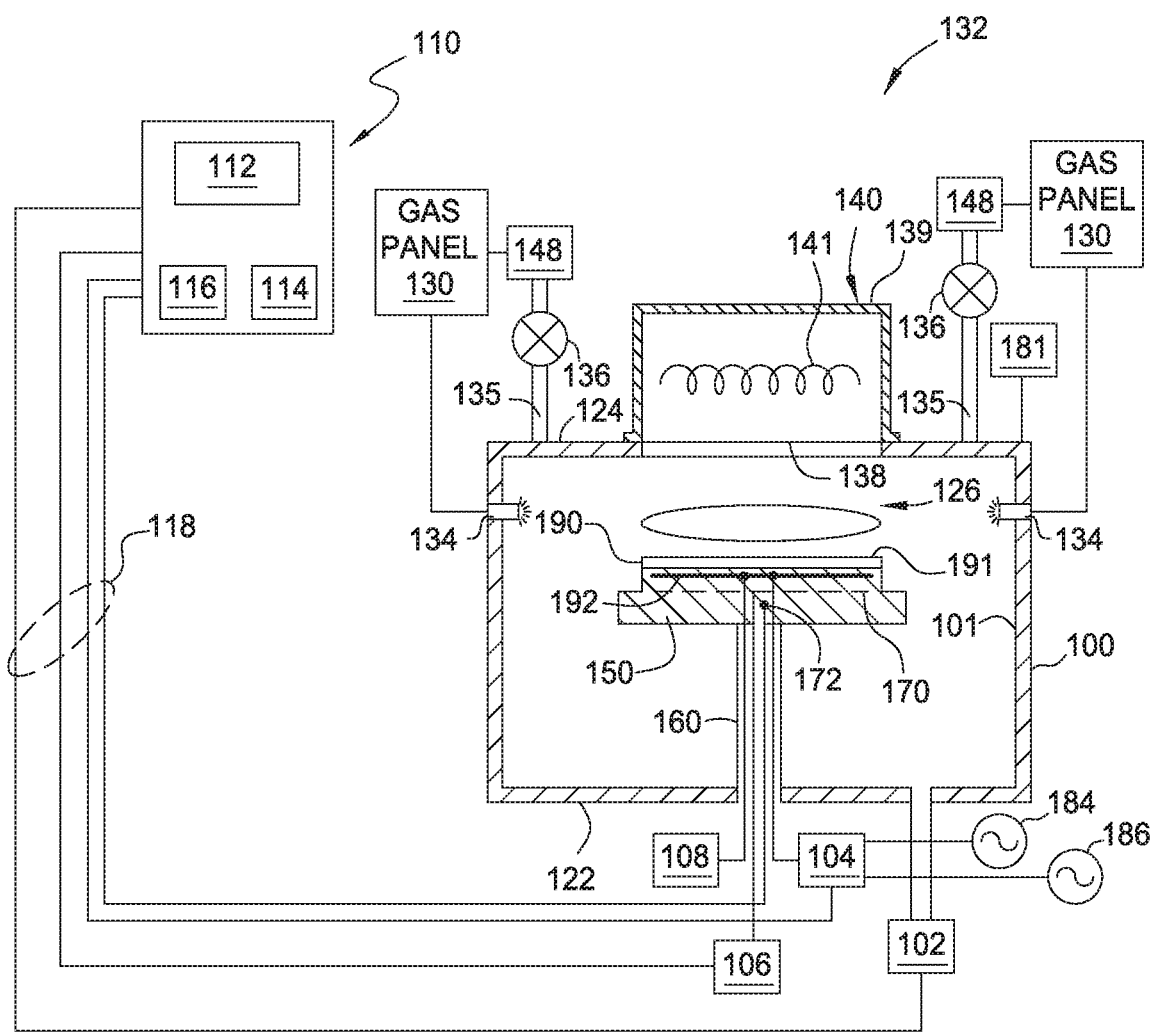
FIG. 1A is a cross section view of a plasma processing chamber adapted to perform a chemical vapor deposition process.

FIG. 1A is a cross sectional view of a plasma processing system 132 suitable for forming a metal silicide layer that may be utilized as conductive nanowires in back-end interconnection structures for semiconductor devices manufacture. The processing system 132 may be a suitably adapted CENTURA®, Producer® SE or Producer® GT processing system available from Applied Materials, Inc., of Santa Clara, Calif. It is contemplated that other processing systems, including those produced by other manufacturers, may benefit from embodiments described herein.

The processing system 132 includes a process chamber 100 coupled to a controller 110. The process chamber 100 generally includes a lid 124, walls 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 450 degrees Celsius.

A temperature sensor 172, such as a thermocouple, may be embedded in the support pedestal 150, and connected through a shaft 160, to monitor the temperature of the pedestal 150 in a conventional manner. The measured temperature is used by the controller 110 to control the power supplied to the heating element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power sources 184, 186. Although the example depicted in FIG. 1A shows two RF bias power sources, 184, 186, it is noted that the numbers of the RF bias power sources may be any number as needed. The RF bias power sources 184, 186 are coupled between the electrode 192 disposed in the pedestal 150 and another electrode, such as a showerhead assembly 142 (depicted in FIG. 4B) or ceiling (lid 124) of the processing chamber 100. The RF bias power source 184, 186 excites and sustains a plasma discharge formed from the gases disposed in the processing region of the processing chamber 100.

In the embodiment depicted in FIG. 1A, the dual RF bias power sources 184, 186 are coupled to the electrode 192 disposed in the pedestal 150 through a matching circuit 104. The signal generated by the RF bias power 184, 186 is delivered through matching circuit 104 to the pedestal 150 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber 100. The vacuum pump 102 is used to maintain a desired gas pressure in the process chamber 100. The vacuum pump 102 also evacuates post-processing gases and by-products of the process from the chamber 100.

A light source 140 is disposed on the processing chamber 100 partially defining the lid 124 of the processing chamber 100. The light source 140 is configured to provide heat energy to the substrate 190 disposed on the substrate pedestal 150 through a window 138. The window 138 is typically made from quartz disposed in the lid 124 of the processing chamber 100 and is at least partially covered by the light source 140.

The light source 140 may comprise various types of radiant heaters. In one example, the light source 140 includes a housing 139 having one or more light sources 141 disposed therein. A power connection (not shown) may be coupled to the light source 140 to facilitate providing power to the light sources 141. In one example, the one or more light sources 141 disposed in the light source 140 may provide radiant energy, such as an IR radiation and/or longer wavelength of UV radiation having a wavelength between about 400 nm and about 4000 nm, to the substrate 190. In one embodiment, radiant energy provided from light sources 141 is believed to enhance photons generated from the plasma to be emitted to the substrate 190 to facilitate chemical reaction during processing. The light sources 141 provide IR and/or UV light, e.g., photons, in the plasma, thus enhancing distribution of photons across the substrate surface 191.

The processing chamber 100 includes one or more gas delivery passages 135 coupled through the lid 124 or walls 101 of the processing chamber 100. The gas delivery passages 135 and the vacuum pump 102 are positioned at opposite ends of the processing chamber 100 to induce laminar flow within the interior volume 126 to minimize particulate contamination. In one embodiment, two more gas delivery passages 135 are disposed through the lid 124 of the processing chamber 100. The gas delivery passage 135 typically is coupled to a valve 136 to selectively allow processing gases from the gas panel 130 flowing into and out of the interior volume 126. Alternatively, the additional passages 134 may be positioned at adjacent walls 101 to provide a more uniform gas distribution across a surface 191 of the substrate 190.

The gas delivery passage 135 is coupled to the gas panel 130 through the valve 136 to provide a gas mixture into the interior volume 126. In one embodiment, the gas delivery passages 135 may be configured as a gas distribution ring wherein the gas mixture may be distributed from adjacent the walls 101 through an array of holes to optimize the flow uniformity. In another embodiment, the gas mixture may be supplied to the processing chamber 100 through a gas distribution plate, such as showerhead 142 (shown in FIG. 1B) disposed below the light source 140. The gas distribution plate may be fabricated by a material transmissive to the heat generated from the light source 140 such as not to substantially interfere with the heating of the substrates positioned on the substrate pedestal 150. Examples of gases that may be supplied from the gas panel 130 may include a metal-containing precursors, reacting gases, and carrier gases. Suitable examples of the metal-containing precursors include N,N'-di-tert-butylacetamidinato)$_2$Ni, Ni(C$_5$H$_5$)$_2$, Ni[N(t-uut)$_2$], Ni(($^t$Bu$_2$N)$_2$CCH$_3$)$_2$, bis(cyclopentadienyl) nickel, bis(ethylpentadienyl)nickel, Ni[(C$_2$H$_5$)(C$_5$H$_4$)$_2$], di(tertiarybutyl)amidonickel, and R$_x$O$_v$Ni$_y$(OR')$_z$ wherein x is greater than or equal to 1, v is greater than or equal to 1, y is greater than or equal to 1, and z is greater than or equal to 1, or any suitable metal-containing precursors, and the like. Other metal-containing precursors may be selected from gases containing transition metal elements, such as Ni, Ti, Fe, Co, Cr, Mn or combinations thereof. Suitable examples of the reacting gases includes a silicon-containing reactant, such as SF$_4$. The silicon-containing reactant can include a silane, such as SiH$_4$, Si$_2$H$_6$, SiH$_2$Cl$_2$, Si$_4$H$_{10}$, Si$_5$H$_{12}$ and the like. Suitable carrier gas includes nitrogen (N$_2$), argon (Ar), hydrogen (H$_2$), alkanes, alkenes, helium (He), oxygen (O$_2$), ozone (O$_3$), wafer vapor (H$_2$O), and the like.

In one embodiment, a remote plasma source (RPS) 148 may be alternatively coupled to the gas delivery passages 135 to assist in forming a plasma in the interior volume 126. The remote plasma source 148 provides plasma formed from the gas mixture provided by the gas panel 130 to the processing chamber 100.

Furthermore, a microwave generator 181 may be coupled to the lid 124 (or the walls 101) of the processing chamber 100. Similarly, the microwave generator 181 coupled to the processing chamber 100 may assist dissociating of the gases from the gas mixture to become reactive species, so as to enhance the chemical reaction across the substrate surface 191.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1A.

Figure 1B:
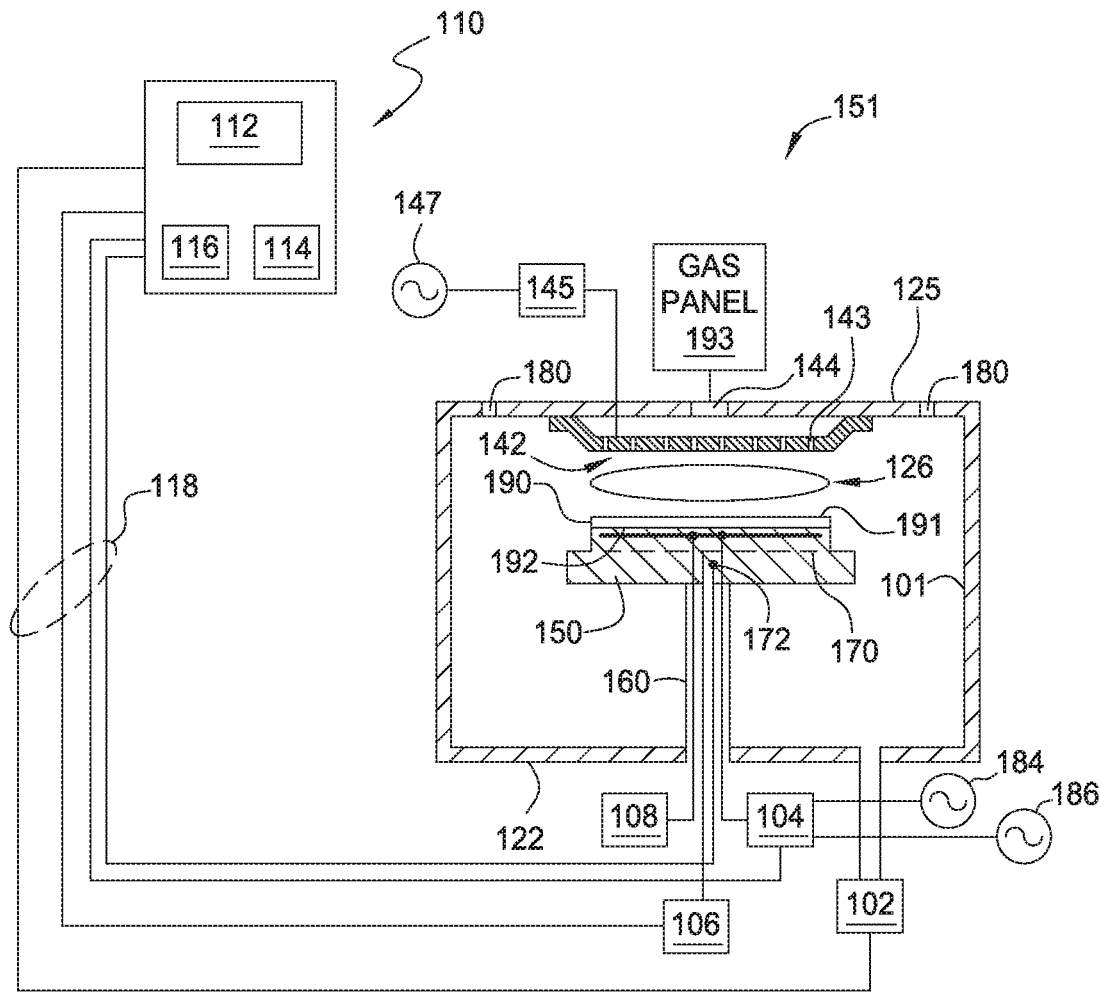
FIG. 1B is a cross section view of another embodiment of a plasma processing chamber adapted to perform a chemical vapor deposition process.

FIG. 1B depicts another embodiment of a plasma processing chamber 151 that may be utilized to form a metal silicide layer. The configuration of the plasma processing chamber 151 depicted in FIG. 1B is similar to the configuration of the processing chamber 100 depicted in FIG. 1A, but with the showerhead 142 coupled to a ceiling 125 of the processing chamber 151. Unlike the light source 140 of FIG. 1A is disposed above the lid 124 of the processing chamber 100, the processing chamber 151 depicted in FIG. 1B has a light source 180 formed on an edge of the ceiling 125 while having the gas panel 193 disposed on a center region of the ceiling 125 of the processing chamber 151. The light source 180 may be in form of annular arrays. Similarly, the light source 180 is similar to the light source 141 that may provide radiation that enhances photon generation in the plasma which may assist chemical reaction occurred on the substrate surface 191.

In one example, the showerhead 142 having a plurality of apertures 143 is coupled to the ceiling 125 of the process chamber 100 above the pedestal 150. The apertures 143 of the showerhead 142 are utilized to introduce process gases from the gas panel 193 into the chamber 151. The apertures 143 may have different sizes, number, distributions, shape, design, and diameters to facilitate the flow of the various process gases for different process requirements. A plasma is formed from the process gas mixture exiting the showerhead 142 to enhance thermal decomposition of the process gases resulting in the deposition of material on the surface 191 of the substrate 190.

The showerhead 142 and substrate support pedestal 150 may be formed by a pair of spaced apart electrodes in the interior volume 126. One or more RF sources 147 provide a bias potential through a matching network 145 to the showerhead 142 to facilitate generation of a plasma between the showerhead 142 and the pedestal 150. Alternatively, the RF power sources 147 and matching network 145 may be coupled to the showerhead 142, substrate pedestal 150, or coupled to both the showerhead 142 and the substrate pedestal 150, or coupled to an antenna (not shown) disposed exterior to the chamber 100. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the showerhead 142 that assists generation of the plasma in the interior volume 126.

Figure 2:
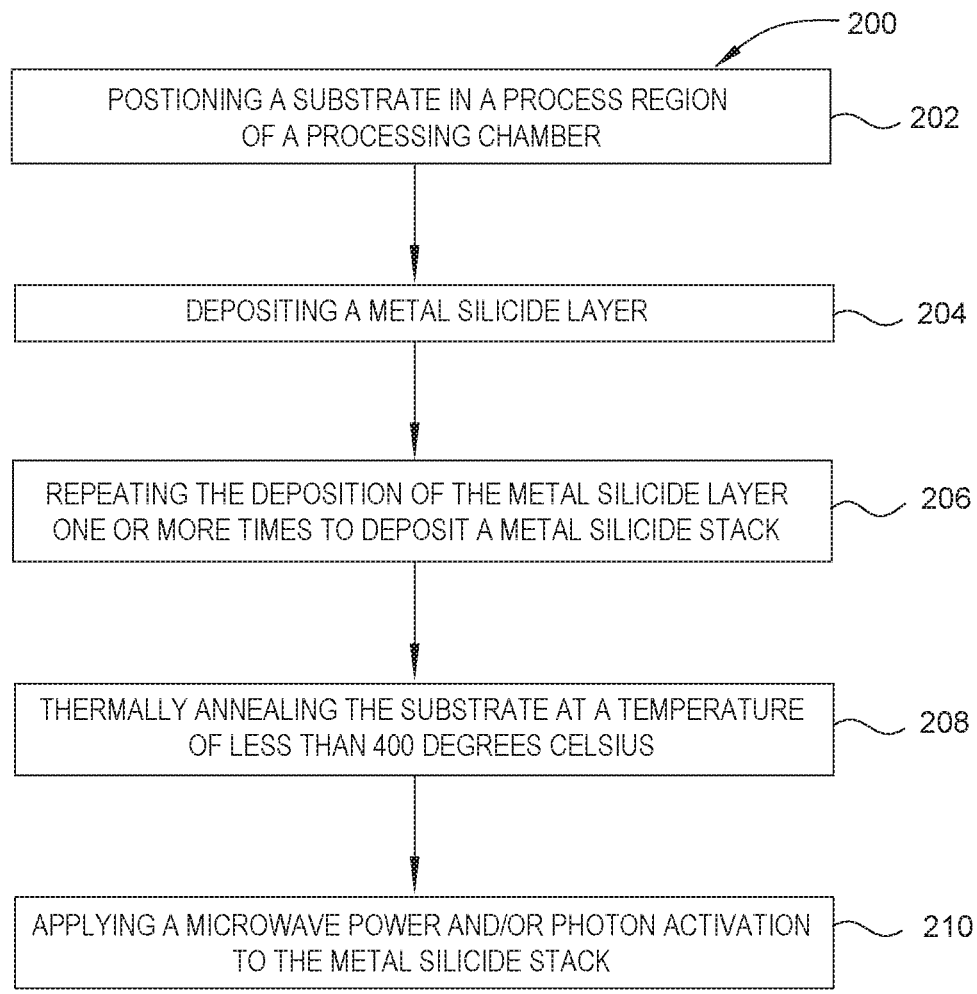
FIG. 2 depicts a flow diagram for forming a metal silicide layer on a substrate, according to embodiments described herein.
Figure 3A:
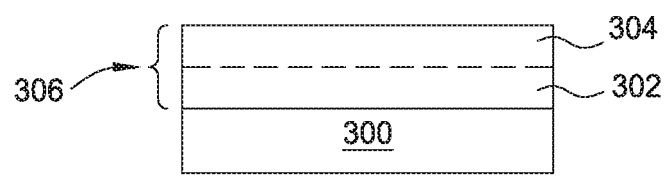
FIGS. 3A-3B depict cross-sectional views of a metal silicide layer formed on a substrate in accordance with the process depicted in FIG. 2.
Figure 3B:
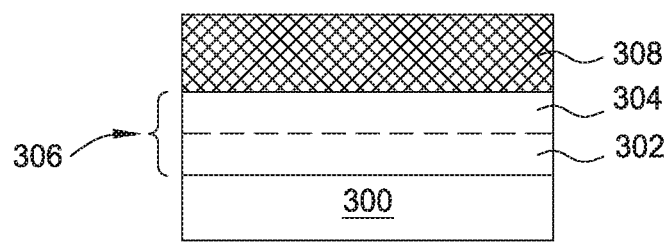

FIG. 2 illustrates a method 200 used to form a metal silicide layer at a low temperature, such as less than 400 degrees Celsius, on a substrate, which may be utilized as conductive nanowires for semiconductor device manufacture. The sequence described in FIG. 2 corresponds to the fabrication stages depicted in FIGS. 3A-3B, which is discussed below. FIGS. 3A-3B illustrate schematic cross-sectional views of a substrate 300 having a film stack 306 disposed thereon that may include a metal silicide stack 308, formed using the method 200 described in FIG. 2.

The method 200 starts with a substrate, such as the substrate 300 depicted in FIG. 3A, disposed in into the processing chamber, at 202. The processing chamber may be a processing chamber described above, such as the processing chambers 100 depicted in FIGS. 1A and 1B, or another suitable processing chamber. The substrate 300 shown in FIG. 3A includes the film stack 306 formed on the substrate 300. The film stack 306 includes a barrier layer 304 disposed on a low-k insulating dielectric material 302. In one example, the substrate 300 may have a substantially planar surface, an uneven surface, or a substantially planar surface having a structure formed thereon. The substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm or 300 mm diameter wafers, as well as, rectangular or square panels. Unless otherwise noted, embodiments and examples described herein are conducted on substrates with a 200 mm diameter, a 300 mm diameter, a 450 mm diameter substrate. In the example wherein a SOI structure is utilized for the substrate 300, the substrate 300 may include a buried dielectric layer disposed on a silicon crystalline substrate. In the embodiment depicted herein, the substrate 300 may be a crystalline silicon substrate.

The barrier layer 304 included in the film stack 306 may be fabricated from TaN, TiN, AlN, TaSiN, TiSiN, or other suitable materials. The low-k insulating dielectric material 302 may have openings (not shown) formed therein configured to have at least one conductive layer disposed therein laterally bounded by the low-k insulating dielectric material 302. The low-k insulating dielectric material 302 may be any suitable silicon oxide containing materials, SiN containing materials, SiOC containing materials, SiC containing materials, carbon based materials, or any other suitable materials. In one example, the low-k insulating dielectric material 302 is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., located in Santa Clara, Calif., and other low-k polymers, such as polyamides. The substrate 300 or the barrier layer 304 may have a feature formed therein.

A metal silicide layer is then deposited, at 204. To form the metal silicide layer, a metal-containing layer is first deposited. The metal-containing layer can be deposited using PVD, CVD, or ALD among others. In one embodiment, the metal-containing layer is deposited using a deposition gas. A deposition gas mixture is then provided into the processing chamber. The deposition gas mixture includes at least a metal-containing precursor. The metal-containing precursor may be a nickel containing compound. Though described in terms of deposition, the metal-containing layer can be a preexisting metal element, such as a metal layer or a metal wire.

In one embodiment, the nickel containing compound may have a formula of $R_xO_vNi_y(OR')_z$, where R and R' are H, $CH_3$, $C_2H_5$, $C_3H_7$, CO, NCO, or other alkyl or aryl groups and x, v and z are integers having a range between 0 and 16 and y is an integer having a range between 0 and 8. In another embodiment, the nickel containing compound may have a formula of $Ni(NRR')_w$, where R and R' may be H, $CH_3$, $C_2H_5$, $C_3H_7$, CO, NCO, or other alkyl or aryl groups and R' may be H, $CH_3$, $C_2H_5$, $C_3H_7$, CO, NCO, or other alkyl or aryl groups and w is an integer having a range between 0 and 8. Examples of suitable nickel containing compounds are N,N'-di-tert-butylacetamidinato)$_2$Ni, Ni($C_5H_5$)$_2$, Ni[N(t-uut)$_2$], Ni(($^t$Bu$_2$N)$_2$CCH$_3$)$_2$, bis(cyclopentadienyl)nickel, bis(ethylpentadienyl)nickel, Ni[($C_2H_5$)($C_5H_4$)$_2$], di(tertiarybutyl)amidonickel, and $R_xO_vNi_y(OR')_z$, $(OR)_2Ni$, wherein R may be methyl, ethyl, propyl, isopropyl, butyl, isobutyl, tertiary butyl, and other alkyl groups having higher numbers of carbon atoms, and the like.

The metal-containing layer is deposited thin, such as less than 5 atoms thick. In one embodiment, the metal-containing layer is less than 2 atoms thick, such as a monolayer. The metal-containing layer may be deposited thin by controlling the residency time of the gas present in the process region, by using a self-limiting deposition gas or by other methods. In one embodiment, the metal-containing reactant supplied in the deposition gas mixture may be maintained at a flow rate by volume between about 20 sccm and about 200 sccm.

A reacting gas is then delivered to the metal-containing layer. The reacting gas includes at least one silicon-containing reactant. The silicon-containing reactant will adsorb readily into the metal-containing layer as well as depositing over the surface of the metal-containing layer. The silicon-containing reactant may include silane ($SiH_4$), disilane ($Si_2H_6$), silicon tetrafluoride ($SiF_4$), silicon tetrachloride ($SiCl_4$), and dichlorosilane ($SiH_2Cl_2$) and the like. The silicon-containing reactant, such as $SiH_4$, can be maintained at a flow rate by volume between about 10 sccm and about 100 sccm.

In some embodiments, a carrier gas, such as nitrogen ($N_2$) and nitric oxide (NO), $O_2$, $N_2O$, hydrogen ($H_2$), ammonia ($NH_3$), a mixture of hydrogen ($H_2$) and nitrogen ($N_2$) and/or inert gas, such as argon (Ar) and helium (He), may be supplied with the deposition gas or the reacting gas into the processing chamber. The addition of different carrier gases or inert gases may change the film structure and/or film chemical components, such as resistivity, thereby adjusting the deposited film to have a desired film property to meet different process requirements. In one example, the metal-containing reactant is bis(cyclopentadienyl)nickel or Ni(C$_5$H$_5$)$_2$ and the reacting gas is SiH$_4$.

While supplying either the metal-containing reactant or the silicon-containing reactant, an inert gas may also be supplied to assist the profile control as needed. Examples of the inert gas supplied in the gas mixture include Ar, He, Ne, Kr, Xe or the like.

Several process parameters may also be controlled while supplying the deposition gas or the reacting gas to perform the deposition process. The pressure of the processing chamber may be controlled at between about 0.5 milliTorr and about 5 Torr. A substrate temperature is maintained less than 400 degrees Celsius, such as between about 15 degrees Celsius to about 400 degrees Celsius, for example between about 200 degrees Celsius and about 380 degrees Celsius. It is believed that low temperature, temperature less than 400 degrees Celsius, is desirable in fabricating nanowires for the semiconductor devices so as to minimize damages, e.g., undesired mechanical densification to the nearly low k materials or conductive material melt-down, on the fabricated device structures. The deposition process (e.g., either gas delivery) may be performed for between about 30 seconds and about 300 seconds to deposit the nickel silicide stack 308. The resulting nickel silicide stack 308 can have a thickness between about 10 Å and about 100 Å.

The nickel silicide (NiSi, Ni$_2$Si, Ni$_3$Si$_2$) stack 308 as formed herein has high thermal stability, low electrical resistivity and high purity, making the nickel silicide (NiSi, Ni$_2$Si, Ni$_3$Si$_2$) stack 308 as a good candidate for use in nanowires in back-end semiconductor devices.

Though described above with relation to nickel, metal silicide can include other metals species. According to one embodiment, the metal species in the metal silicide nanowire can also be varied depending on the application and material properties desired, such as conductivity, bandgap, work function and phase. Example metal species of interest for nanowires include Ni, Ti, Fe, Co, Cr, Mn, or other transition metal elements. The method of fabricating these nanowires can include delivery of silicon to the metal surface, delivery of the metal to silicon nanowires, or simultaneous delivery of silicon and the metal species.

While supplying the deposition gas and/or the reacting gas into the processing chamber, a microwave power may be generated from the microwave generator 181 (depicted in FIG. 1A) to either gas mixture to assist dissociating the precursors into reactive species in a plasma. The microwave power as generated energizes the deposition gas and/or the reacting gas within the interior volume 126 such that the plasma may be sustained. In one example, the microwave power may be operated at a frequency between 0.3 GHz and about 300 GHz. The microwave power may be applied between about 10 Watts and about 5000 Watts. In some embodiments, in addition to the microwave power as generated, one or more RF sources 147 (depicted in FIG. 1A) and/or RF bias 184, 186 (depicted in FIGS. 1A and 1B) may also be generated during the deposition process to assist dissociating the deposition gas and/or the reacting gas the plasma. In one example, the RF source power may be supplied between about 100 Watts and about 600 Watts and at a frequency between about 250 kHz and about 13.6 MHz. A RF bias power may also be supplied as needed. The RF bias power may be supplied at between about 10 Watts and about 100 Watts. In one embodiment, the RF source power may be pulsed with a duty cycle between about 10 to about 95 percent at a RF frequency between about 500 Hz and about 10 kHz.

While forming the plasma from the deposition gas and/or the reacting gas, a light radiation may be emitted to the deposition gas and/or the reacting gas in the plasma so as to enhance dissociation of the gas mixtures into reactive species. The light radiation may be emitted from the light source 140 mounted on the processing chamber 100, as depicted in FIG. 1A, or from the light source 180 formed on an edge of the processing chamber 151 depicted in FIG. 1B.

It is believed that the radiant energy, e.g., photons, from the light sources 140, 180 may enhance generation of the IR/UV light, e.g., photons, at the substrate surface, thereby enhancing the chemical reaction occurring at the substrate surface without having to excessively increase the substrate temperature. In one embodiment, the light sources 140, 180 may emit a radiant energy at a wavelength between about 1 mm and about 1000 mm. The radiant energy may include an IR light, UV light, or combinations thereof.

The deposition of the metal silicide layer can be repeated one or more times to deposit a metal silicide nanowire, at 206. The metal silicide nanowire may be deposited as a blanket across the surface of the substrate/barrier layer, into one or more features or both. In one embodiment, the repeated deposition includes the metal silicide deposition as described in elements 202 and 204 being repeated sequentially one or more times.

After a desired thickness of the nickel silicide stack 308 is reached, the deposition process may then be terminated. In one example, the nickel silicide stack 308 is a nickel rich film with higher ratio of nickel elements than the ratio of the silicon elements formed in the nickel silicide stack 308. In one example, the nickel silicide stack 308 have may a ratio of Ni element to Si element substantially between about 0.8:1 and about 2:1. More nickel elements are formed on an upper/outer region of the nickel silicide stack 308, as compared to the silicon elements formed in a lower/inner region of the nickel silicide stack 308. XRD analysis indicates that the nickel silicide stack 308 as formed has strong (111), (220) and (311) plane peaks. The nickel silicide stack 308 may have a resistivity between about 8 μOhm-cm and about 25 μOhm-cm.

In some embodiments, the deposition method 200 may include a thermal annealing process, at 208. The deposition process may be the method 200 described above or any suitable deposition techniques, such as plasma enhanced chemical vapor deposition (PECVD), physical vapor deposition process (PVD), metal organic chemical vapor deposition (MOCVD), thermal chemical vapor deposition (Thermal-CVD) process, low pressure chemical vapor deposition (LPCVD), sub-atmosphere chemical vapor deposition (SACVD) and the like, followed by a thermal annealing process. After the nickel silicide stack 308 is formed on the substrate 300, a low temperature, such as less than 400 degrees Celsius, thermal/annealing process may be performed on the nickel silicide stack 308 in a thermal processing chamber, such as a RTP chamber or any suitable heating processing chamber, capable of performing a microwave assisted thermal/annealing process. The thermal processing chamber may be similarly configured as the processing chamber described in FIGS. 1A and 1B, with a heating module, such as a lamp or heating assembly formed therein with a microwave generator coupled thereto. The microwave power applied during thermal/annealing process may gently heat/thermal process the nickel silicide stack 308 without adversely destroy or damage the film structures of the nickel silicide stack 308. The microwave power may be regulated similar to the microwave power described at operation 204 described in method 200 with reference to FIG. 2. In one example, the microwave power may be operated at a frequency between 0.3 GHz and about 300 GHz. The microwave power may be applied between about 10 Watts and about 5000 Watts. While performing the thermal/annealing process, a carrier gas may be supplied during the heat/thermal process. The carrier gas may be selected from a group consisting of $N_2$, $O_2$, $H_2$, inert gas, or any suitable gases as needed.

While performing the thermal/annealing process, a microwave power and/or a light radiation may be emitted to the metal silicide stack 308 so as to enhance reconstruction of the film structures of the metal silicide stack 308, at 210. It is believed that the radiant energy, e.g., photons, may enhance the film structure rearrangement or reconstruction to the nickel silicide stack 308. In one embodiment, the light radiation may have a wavelength between about 1 mm and about 1000 mm. The light radiation may include an IR light, UV light, or combinations thereof.

The thermal/annealing process followed by the deposition process is performed to repair, densify and enhance lattice structures of the nickel silicide stack 308. For example, after the thermal/annealing process, the nickel silicide stack 308 may have stronger crystalline structures of (111), (220) and (311) plane peaks under XRD analysis, as compared to the nickel silicide stack 308 prior to, e.g., without, the thermal/annealing process.

Thus, methods and an apparatus for forming a metal silicide stack at low temperature are provided. The method and apparatus advantageously forming a metal silicide stack at a temperature less than 400 degrees Celsius utilizing a plasma enhanced chemical vapor deposition or other suitable deposition techniques. The metal silicide layers are formed under low temperature and may be utilized to form conductive nanowire for next generation semiconductor devices. Further, the metal silicide stack and resulting nanowires are deposited in a low resistivity phase at lower temperature (below 400 degrees Celsius). Thus, the metal silicide stack and nanowires are suitable for interconnect integration while maintaining the thermal budget for BEOL deposition.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. A method of processing a substrate, comprising:
  positioning a substrate in a process region of a process chamber, the substrate having a feature formed therein;
  depositing a metal silicide layer into the feature, the depositing comprising:
    depositing a metal layer comprising a transition metal into the feature, the metal layer being no more than 2 atoms thick, wherein the transition metal is selected from the group consisting of Nickel (Ni), Iron (Fe), Cobalt (Co), Chromium (Cr), and Manganese (Mn), and when the transition metal is Ni, the metal layer is deposited using a metal-containing precursor selected from the group consisting of (N,N'-di-tert-butyl-acetamidinato)$_2$Ni, Ni[N(t-uut)$_2$], Ni(($^t$Bu$_2$N)$_2$CCH$_3$)$_2$, bis(ethylpentadienyl)nickel, Ni[(C$_2$H$_5$)(C$_5$H$_4$)$_2$], and di(tertiary-butyl)amidonickel;
    delivering a silicon-containing reactant to the metal layer, the substrate being maintained at a temperature between 25 degrees Celsius and 400 degrees Celsius, the silicon-containing reactant reacting with at least a portion of the metal layer; and
    while delivering the silicon-containing reactant to the metal layer, coupling a microwave power to the silicon-containing reactant to form a plasma from the silicon-containing reactant, wherein the microwave power is provided to the process region of the process chamber at a power level of from 10 W to 5000 W; and
  repeating the deposition of the metal silicide layer one or more times to deposit a metal silicide stack,
  wherein:
    while delivering the silicon-containing reactant to the metal layer, coupling an RF source power to the silicon-containing reactant to form a plasma from the silicon-containing reactant, or
    while coupling the microwave power to the silicon-containing reactant, exposing the silicon-containing reactant to a radiant energy, the radiant energy comprising UV light.

2. The method of claim 1, wherein the metal layer is a monolayer.

3. The method of claim 1, wherein the silicon-containing reactant comprises silane.

4. The method of claim 1, wherein the metal silicide stack comprises nickel silicide or cobalt silicide.

5. The method of claim 1, wherein the metal silicide stack has a thickness between about 10 Å and about 100 Å.

6. The method of claim 1, wherein the metal silicide stack is formed as nanowires for semiconductor back-end interconnection structure.

7. The method of claim 1, wherein when the transition metal is nickel, the metal silicide stack has a ratio of Ni element to Si element substantially between about 0.8:1 and about 2:1.

8. A method of processing a substrate in a process chamber, comprising:
  positioning a substrate in a process region of a process chamber, the substrate having a feature formed therein;
  depositing a metal silicide layer into a feature formed in the substrate, the depositing comprising:
    depositing a metal layer comprising a transition metal into the feature, the metal layer being no more than 2 atoms thick, wherein the transition metal is selected from the group consisting of Nickel (Ni), Iron (Fe), Chromium (Cr), and Manganese (Mn), and when the transition metal is Ni, the metal layer is deposited using a metal-containing precursor selected from the group consisting of (N,N'-di-tert-butyl-acetamidinato)$_2$Ni, Ni[N(t-uut)$_2$], Ni(($^t$Bu$_2$N)$_2$CCH$_3$)$_2$, bis(ethylpentadienyl)nickel, Ni[(C$_2$H$_5$)(C$_5$H$_4$)$_2$], and di(tertiary-butyl)amidonickel; and
    exposing the metal layer to a plasma formed from a silicon-containing reactant using a first microwave power, the silicon-containing reactant reacting with at least a portion of the metal layer, wherein the first microwave power is provided to the process region of the process chamber at a power level of from 10 W to 5000 W, and wherein while exposing the metal layer to a plasma formed from a silicon-containing reactant, coupling an RF source power to the silicon-containing reactant to form a plasma from the silicon-containing reactant;
  repeating the deposition of the metal silicide layer one or more times to deposit a metal silicide stack;

thermally treating the metal silicide stack at a temperature between 25 degrees Celsius and 400 degrees Celsius in the presence of radiant energy; and applying a second microwave power in the process chamber while thermally treating the metal silicide stack.

9. The method of claim 8, wherein the metal layer is a monolayer.

10. The method of claim 8, wherein the silicon-containing reactant is selected from a group consisting of silane ($SiH_4$), di-silane ($Si_2H_6$), silicon tetrafluoride ($SiF_4$), silicon tetrachloride ($SiCl_4$), and dichlorosilane ($SiH_2Cl_2$).

11. The method of claim 8, wherein the radiant energy comprises UV radiation.

12. The method of claim 8, wherein the metal silicide stack is formed as nanowires for semiconductor back-end interconnection structure.

13. The method of claim 8, wherein when the transition metal is nickel, the metal silicide stack has a ratio of Ni element to Si element substantially between about 0.8:1 and about 2:1.

14. A method of processing a substrate, comprising:
    positioning a substrate in a process region of a process chamber, the substrate having a feature formed therein;
    depositing a nickel silicide layer into the feature, the depositing comprising:
        depositing a nickel layer into the feature, the nickel layer being a monolayer, wherein the nickel layer is deposited using a metal-containing precursor selected from the group consisting of (N,N'-di-tert-butyl-acetamidinato)$_2$Ni, Ni[N(t-uut)$_2$], Ni(($^t$Bu$_2$N)$_2$CCH$_3$)$_2$, bis(ethylpentadienyl)nickel, Ni[(C$_2$H$_5$)(C$_5$H$_4$)$_2$], and di(tertiary-butyl)amidonickel; and
        exposing the nickel layer to a plasma formed from a silane using a first microwave power, the first microwave power being provided to the process region of the process chamber at a power level of from 10 W to 5000 W, the substrate being maintained at a temperature between 25 degrees Celsius and 400 degrees Celsius, the silane reacting with at least a portion of the nickel layer;
    repeating the deposition of the nickel silicide layer one or more times to deposit a nickel silicide stack, the nickel silicide stack having a ratio of Ni element to Si element substantially between about 0.8:1 and about 2:1; and
    applying a second microwave power in the process chamber while thermal treating the nickel silicide stack, wherein:
        while delivering the silane to the nickel layer, coupling an RF source power to the silane to form a plasma from the silane, or
        while coupling the first or second microwave power to the silane, exposing the silane to a radiant energy, the radiant energy comprising UV light.

15. The method of claim 14, wherein the silane is selected from the group consisting of $SiH_4$, $Si_2H_6$, $SiH_2Cl_2$, $Si_4H_{10}$, and $Si_5H_{12}$.

* * * * *